United States Patent [19]

Lin et al.

[11] Patent Number: 5,218,568
[45] Date of Patent: Jun. 8, 1993

[54] ELECTRICALLY-ERASABLE, ELECTRICALLY-PROGRAMMABLE READ-ONLY MEMORY CELL, AN ARRAY OF SUCH CELLS AND METHODS FOR MAKING AND USING THE SAME

[75] Inventors: Sung-Wei Lin, Houston; Manzur Gill, Arcola; Inn K. Lee, Houston, all of Tex.

[73] Assignee: Texas Instruments Incorporated, Dallas, Tex.

[21] Appl. No.: 809,462

[22] Filed: Dec. 17, 1991

[51] Int. Cl.⁵ .............................................. G11C 11/34
[52] U.S. Cl. ...................................... 365/185; 257/314
[58] Field of Search ........................... 365/185, 189.01; 357/23.5

[56] References Cited

U.S. PATENT DOCUMENTS

| | | | |
|---|---|---|---|
| 4,180,826 | 12/1979 | Shappir | 357/41 |
| 4,203,158 | 5/1980 | Frohman-Bentch | 365/185 |
| 4,258,466 | 3/1981 | Kuo et al. | 29/571 |
| 4,288,256 | 9/1981 | Ning et al. | 148/1.5 |
| 4,373,248 | 2/1983 | McElroy | 29/571 |
| 4,377,818 | 3/1983 | Kuo et al. | 357/23 |
| 4,377,857 | 3/1983 | Tickle | 365/185 |
| 4,451,904 | 5/1984 | Sugiura et al. | 365/182 |
| 4,493,057 | 1/1985 | McElroy | 365/182 |
| 4,545,034 | 10/1985 | Chatterjee et al. | 365/182 |
| 4,569,117 | 2/1986 | Baglee et al. | 29/576 |
| 4,590,504 | 5/1986 | Guterman | 357/23.11 |
| 4,597,060 | 6/1986 | Mitchel et al. | 365/185 |

(List continued on next page.)

FOREIGN PATENT DOCUMENTS

| | | |
|---|---|---|
| 0105802 | 4/1984 | European Pat. Off. . |
| 0144900 | 6/1985 | European Pat. Off. . |
| 8501146 | 8/1984 | PCT Int'l Appl. . |

OTHER PUBLICATIONS

M. McConnell, et al., "An Experimental 4-Mb Flash EEPROM with Sector Erase" *IEEE Journal of Solid-State Circuits*, vol. 26, No. 4, Apr. 1991.

M. Gill et al., "A Novel Sublithographic Tunnel Diode Based 5V-Only Flash Memory", *IEEE*, 1990, IEDM 90-119.

Dumitru Cioaca et al., "A Million Cycle CMOS 256K EEPROM", *IEEE*, 1987, pp. 684-691.

*Primary Examiner*—Eugene R. LaRoche
*Assistant Examiner*—Son Dinh
*Attorney, Agent, or Firm*—Theodore D. Lindgren; Leo N. Heiting; Richard L. Donaldson

[57] ABSTRACT

An electrically-erasable, electrically-programmable read-only memory cell 10 is formed at a face of a layer of semiconductor 30 of a first conductivity type. A first source/drain region 16 and a second source/drain region 20 are formed in the face of layer of semiconductor 30 of a second conductivity type opposite the first conductivity type and spaced by a first channel area 50. A third source/drain region 18 is formed in the face of semiconductor layer 30 of the second conductivity type spaced from second source/drain region 20 by a second channel area 52. A thick insulator region 44 is formed adjacent at least a portion of second source/drain region 20 and includes a lateral margin of sloped thickness overlying a corresponding lateral margin of second source/drain region 20. The corresponding lateral margin of second source/drain region 20 has a graded dopant concentration directly proportionate with the sloped thickness of the overlying lateral margin of thick insulator region 44. A differentially grown insulator region 54 overlies second source/drain region 20 and includes a lateral margin of sloped thickness. A thin insulator tunneling window 62 overlies an area 60 of second source/drain region 20, tunneling window 62 formed between and spacing the lateral margin of the thick insulator region 44 and the lateral margin of differentially grown insulator region 54. A floating gate conductor 26 is disposed adjacent tunneling window 62 and insulatively adjacent second channel area 52. A control gate conductor 28 is disposed insulatively adjacent floating gate conductor 28. A gate conductor 24 is disposed insulatively adjacent first channel area 50.

4 Claims, 8 Drawing Sheets

U.S. PATENT DOCUMENTS

| | | | |
|---|---|---|---|
| 4,622,737 | 11/1986 | Ravaglia | 29/571 |
| 4,652,897 | 3/1987 | Okuyama et al. | 357/23.5 |
| 4,668,970 | 5/1987 | Yatsuda et al. | 357/23.5 |
| 4,672,409 | 6/1987 | Takei et al. | 357/33.5 |
| 4,686,558 | 8/1987 | Adam | 357/42 |
| 4,695,979 | 9/1987 | Tuvell et al. | 365/185 |
| 4,698,787 | 10/1987 | Mukherjee et al. | 365/185 |
| 4,715,014 | 12/1987 | Tuvell et al. | 365/185 |
| 4,718,041 | 1/1988 | Baglee et al. | 365/185 |
| 4,733,482 | 3/1988 | West et al. | 357/23.5 |
| 4,736,342 | 4/1988 | Imondi et al. | 365/185 |
| 4,742,492 | 5/1988 | Smayling et al. | 365/218 |
| 4,750,024 | 6/1988 | Schreck | 357/23.5 |
| 4,766,473 | 8/1988 | Kuo | 357/23.5 |
| 4,768,080 | 8/1988 | Sato | 357/54 |
| 4,794,433 | 12/1988 | Kamiya et al. | 357/23.5 |
| 4,804,637 | 2/1989 | Smayling et al. | 437/52 |
| 4,829,351 | 5/1989 | Engles et al. | 357/23.5 |
| 4,853,895 | 8/1989 | Mitchell et al. | 365/185 |
| 4,855,800 | 8/1989 | Esquivel et al. | 357/23.5 |
| 4,872,041 | 10/1989 | Sugiura et al. | 357/23.5 |
| 4,912,676 | 3/1990 | Paterson et al. | 365/185 |
| 4,924,437 | 5/1990 | Paterson et al. | 365/185 |
| 4,947,222 | 8/1990 | Gill et al. | 365/23.5 |
| 5,008,721 | 4/1991 | Gill et al. | 365/185 X |
| 5,041,147 | 8/1991 | Yoshizawa et al. | 365/185 |

FIG. 9a
PROGRAM

FIG. 9b
ERASE

FIG. 9c
READ

ELECTRICALLY-ERASABLE, ELECTRICALLY-PROGRAMMABLE READ-ONLY MEMORY CELL, AN ARRAY OF SUCH CELLS AND METHODS FOR MAKING AND USING THE SAME

TECHNICAL FIELD OF THE INVENTION

The present invention relates generally to memory devices, and more particularly to electrically-erasable, electrically-programmable, read-only memory cells, arrays of such cells, and methods for making and using such devices.

BACKGROUND OF THE INVENTION

Electrically-erasable, electrically-programmable, read-only memories typically consist of an array of MOSFETs with a floating gate in the case of a double poly structure or with NMOS in the case of a single poly structure. In the case of the double poly floating gate structure, a typical cell consists of a substrate of a specified conductivity type with two heavily doped regions of an opposite conductivity type formed in its face. The heavily doped regions, designated the drain and the source, are separated by a field effect transistor channel region. A thin oxide layer is grown on the surface of the channel and a floating gate is then formed on the oxide. A control gate, separated from floating gate by another layer of oxide, is formed so as to be capacitively coupled thereto upon the application of a control gate voltage.

In the case of the double poly floating gate structure, each EEPROM cell stores a bit of information as a quantity of electrons on the floating gate. A charged floating gate raises the threshold voltage of the MOS field effect transistor preventing current flow through the channel when a reading voltage difference is established between the drain and the source, thereby storing a logic "zero". An uncharged floating gate does not alter the threshold voltage of the channel of the field effect transistor, and therefore a normal data reading voltage applied to the control gate will exceed the threshold voltage such that current will pass through the channel when a voltage difference is established between the drain and the source, thereby storing a logic "one".

One category of double poly floating gate EEPROM cells employs only a single relatively low voltage supply for all the programming, erasing and reading operations. Programming and erasing are accomplished by Fowler-Nordheim tunneling through a thin dielectric tunneling window. To program a cell, a relatively high voltage (typically on the order of +18 volts) is applied to the control gate while the source/drain region adjacent the thin tunneling window is held at a low voltage (typically zero volts or ground). The resulting difference in voltage between the floating gate and the source/drain region adjacent the tunneling window causes electrons to tunnel across the silicon dioxide barrier. To erase a selected cell, a relatively high voltage (typically on the order of +18 volts) is applied to the source/drain region adjacent the tunneling window while a low voltage (typically zero volts or ground) is applied to the control gate. In this case, the resulting voltage difference between the source/drain region and the floating gate causes electrons to tunnel from the floating gate to the source/drain region across the thin oxide tunnelling window.

A full featured EEPROM can be programmed and erased cell by cell, or in groups of cells. This is in contrast to "flash" erasable EEPROM cells in which the entire array is typically erased at once. Full featured EEPROM include one select field effect transistor and one field effect transistor with a floating gate structure (the memory transistor). Currently available full featured EEPROMS which include a thin oxide tunnelling window for programming and erasing are large because the minimum geometry of the tunnelling windows has been limited by the available manufacturing processes. This presents significant disadvantages for memory designers. A smaller cell size is desirable in order to provide a more dense memory array with more EEPROM cells for a given silicon area. Further, smaller cell size reduces the manufacturing costs and increases manufacturing yields.

Thus, the need has arisen for a full featured EEPROM cell with reduced cell size, an array of such cells and methods for making and using the same.

SUMMARY OF THE INVENTION

An electrically-erasable, electrically-programmable read-only memory cell is formed at a face of a layer of semiconductor of a first conductivity type and includes first and second source/drain regions formed in the face of a second conductivity type opposite the first conductivity type and spaced by a first channel area. A third source/drain region is formed in the face of the second conductivity type and is spaced from the second source/drain region by a second channel area. A thick insulator region is formed adjacent at least a portion of the second source/drain region and has a lateral margin of sloped thickness overlying a corresponding lateral margin of the second source/drain region, the corresponding lateral margin of the second source/drain region having a graded dopant concentration directly proportionate with the sloped thickness of the overlying lateral margin of the thick insulator. A differentially grown insulator region is formed overlying the second source/drain region and includes a lateral margin of sloped thickness. A thin insulator of tunneling window overlies an area of the second source/drain region, the tunneling window disposed between the lateral margin of the thick insulator region and the lateral margin of the differentially grown insulator region. A floating gate conductor is disposed adjacent the tunneling window and insulatively adjacent the second channel area while a gate conductor is disposed insulatively adjacent the first channel area. A control gate conductor is formed insulatively adjacent the floating gate conductor.

The present invention presents distinct advantages over prior art memory cells. The provision of a self-aligned thin insulator tunneling window allows the fabrication of memory cells of reduced area and consequently the fabrication of more dense arrays of memory cells. The present invention uses buried bitlines such that an array of such cells can be a contactless array or one with only a single contact for every sixteen (or 32 or 64) cells. This reduces the number of contacts, reduces cell area, and improves manufacturability. Further, the thin insulator tunneling window provides for a cell which can be programmed and erased using a single relatively low-power supply. Additionally, memory cells according to the present invention are full featured cells which include a select transistor. The select transistor provides additional isolation of the memory transistor substantially reducing problems with read and write disturb.

BRIEF DESCRIPTION OF THE DRAWINGS

Other aspects of the invention and their advantages will be discerned when one refers to the following detailed description as taken in conjunction with the drawings, in which:

FIGS. 2b and 2c are greatly enlarged schematic elevational views of the semiconductor workpiece during the initial stage of fabrication shown in FIG. 2a, FIG. 2B taken substantially along line 2b—2b of FIG. 2a, FIG. 2c taken substantially along line 2c—2c of FIG. 2a;

DETAILED DESCRIPTION OF THE PREFERRED EMBODIMENT

Figure 1:
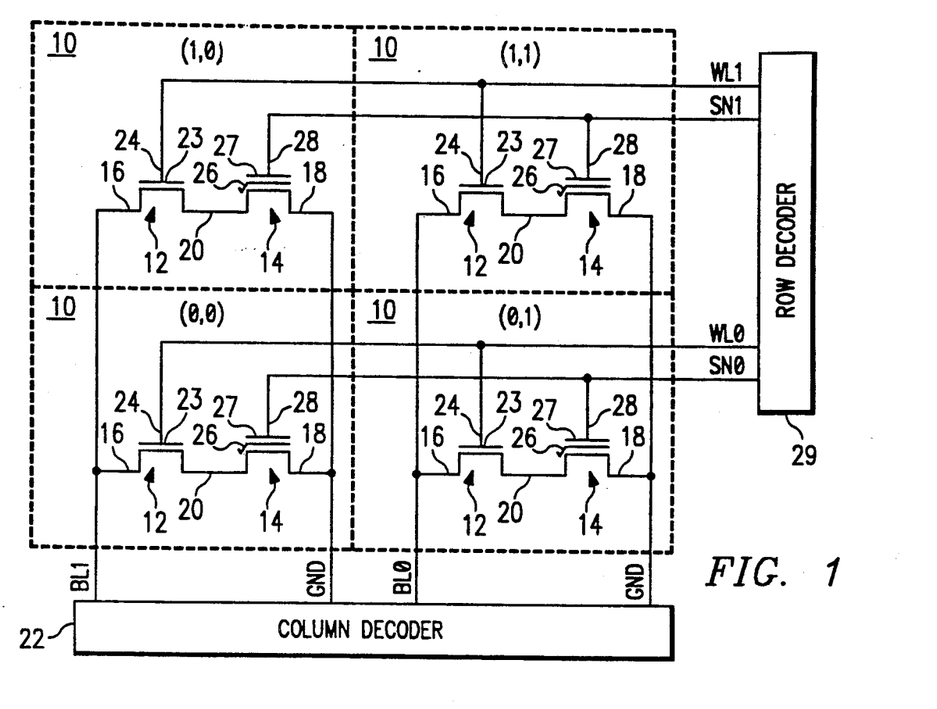
FIG. 1 is an electrical schematic diagram of a small section of an array of cells according to the invention.

An electrical schematic diagram of a portion of an array of an electrically-erasable, electrically-programmable read-only memory (EEPROM) cells according to the invention is shown in FIG. 1. Each memory cell 10 includes a select field effect transistor 12 and a memory field effect transistor 14 with a floating gate structure. Each select transistor 12 along the column of cells includes a source/drain region formed as part of an elongated bitline 16 shared by the cells in the column, in FIG. 1 labeled BL0 and BL1. Each memory transistor 14 in a column includes a source/drain formed as part of an elongated groundline 18 shared by the cells in the column, in FIG. 1 labeled GND. For Cell 10, the select field effect transistor 12 and the memory transistor 14 share a source/drain region 20. In the illustrated embodiment, each of the elongated bitlines 16 and groundlines 18 are coupled to a column decoder 22.

In the array of FIG. 1, each select transistor 12 in a row of cells includes a gate 23 formed as part of a common wordline 24 provided for the corresponding row of cells (and labeled WL0 and WL1 in FIG. 1). Each memory transistor 14 includes a floating gate 26 and a control gate 27 formed as part of a common senseline 28 provided for the corresponding row of cells, in FIG. 1 labeled SN0 and SN1. Wordlines 24 and sense lines 28 are coupled to an associated row decoder 29.

The fabrication of an EEPROM cell 10 according to the preferred embodiment will be described next, followed by the operation of the array of cells as shown in FIG. 1.

Figure 2A:
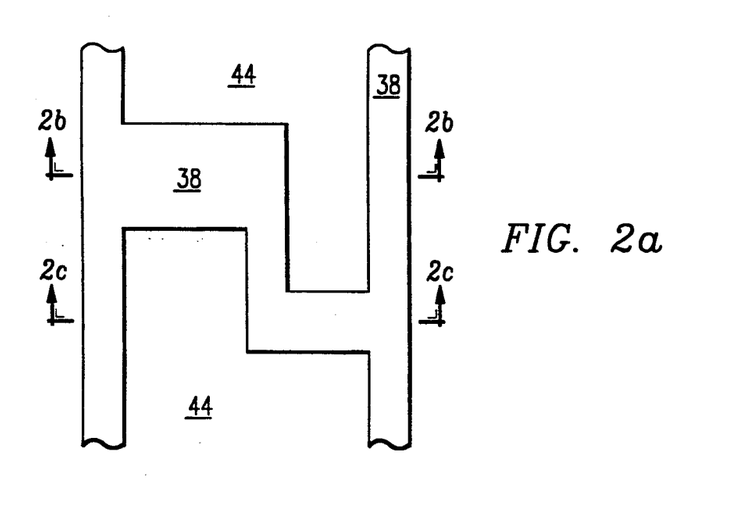
FIG. 2a is a greatly enlarged plan view of a semiconductor workpiece showing the initial stage of fabrication of the memory call according to the invention.
Figure 2B:
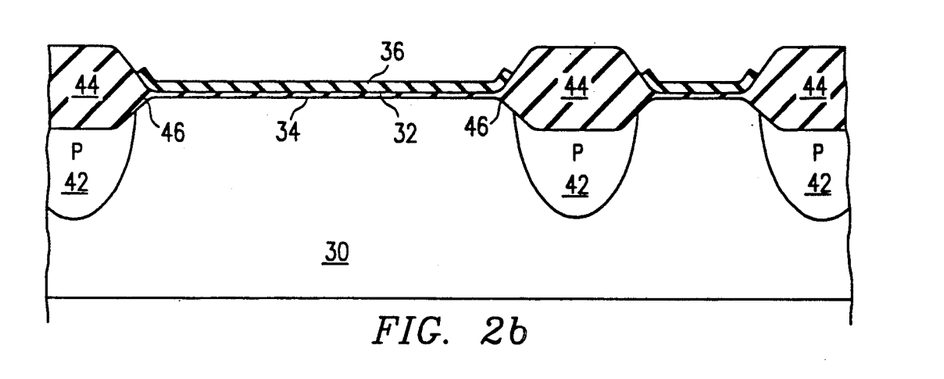
Figure 2C:
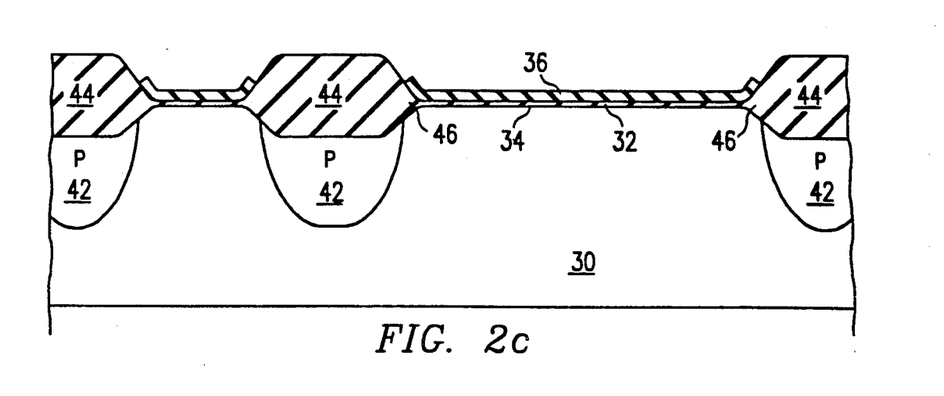

Referring to FIGS. 2a-c, a semiconductor substrate or layer is shown having a (p−) epitaxial layer 30 grown thereon. FIG. 2a is a plan view corresponding to the Fabrication of the entire cell 10, FIG. 2b is a sectional view corresponding substantially to the fabrication of select transistor 12 and FIG. 2c is a sectional view corresponding substantially to the fabrication of memory transistor 14. A layer 32 of oxide is deposited or grown on surface 34 of (p−) layer 30. This is followed by the deposition of a nitride layer 36 on top of the oxide layer 32. The nitride layer 36 is patterned and etched to define an active device area 38 over which it resides, which will later include source/drain regions 16, 18 and 20 and corresponding channel areas for transistors 12 and 14 of cell 10.

The fabrication process detailed herein omits steps necessary for the co-fabrication of a plurality of CMOS logic transistors cited in the periphery of the chip. Since the techniques for fabricating such transistors are conventional, they will not be described here.

A boron implant at a dose of approximately $8 \times 10^{12}$ cm$^{-2}$ is performed to create (p) channel stop regions 42. Then, thick field oxide regions 44 are thermally grown using a localized oxidation process to a thickness of approximately 9000 Angstroms by exposing the substrate to steam at about 900° C. for several hours, using any of several conventional techniques. The thermal oxide regions 44 grow beneath the edges of the adjacent nitride layers 36, creating bird's beaks 46 instead of sharp transitions.

Figure 3A:
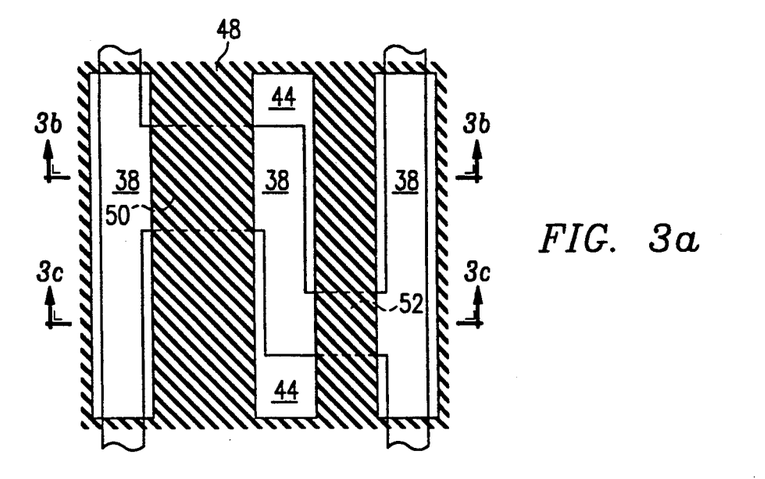
FIGS. 3a-3c, 4a-4c, 5a-5c and 6a-6c are a series of plan and elevational sectional views showing subsequent fabrication steps.
Figure 3B:
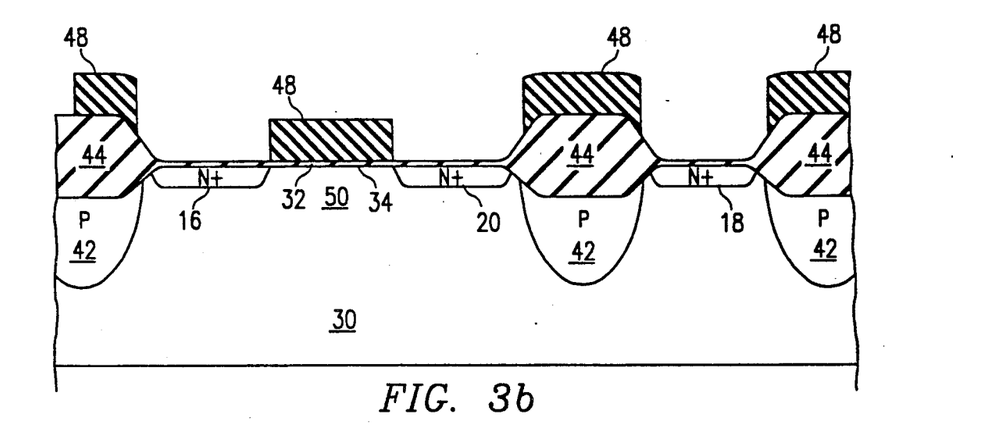
Figure 3C:
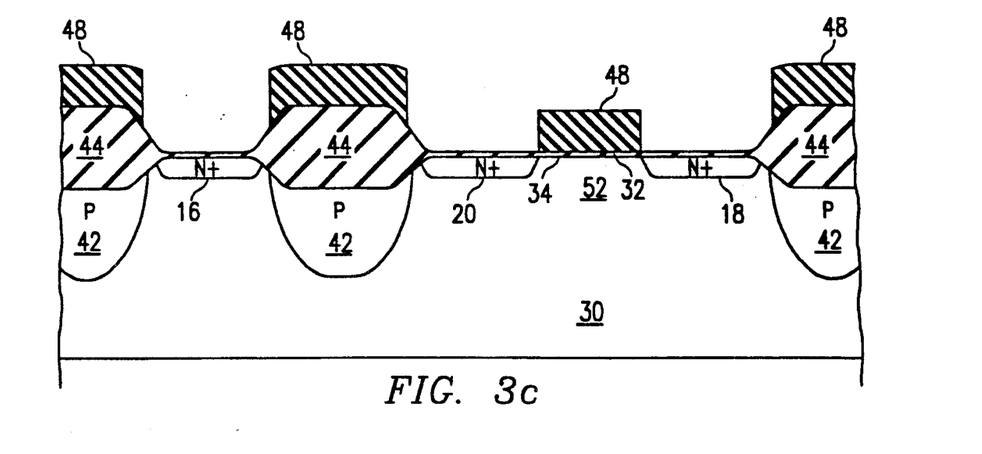

Referring next to FIGS. 3a-c, nitride layer 36 and pad oxide layer 32 are removed. A layer 48 of photoresist is deposited and patterned to act as an implant mask for an arsenic implant at a dose of about $6 \times 10^{15}$ cm$^{-2}$ and at an energy of about 130 kev. This implant creates elongated source/drain regions 16, 18 and 20, spaced by channel regions 50 and 52.

Figure 4A:
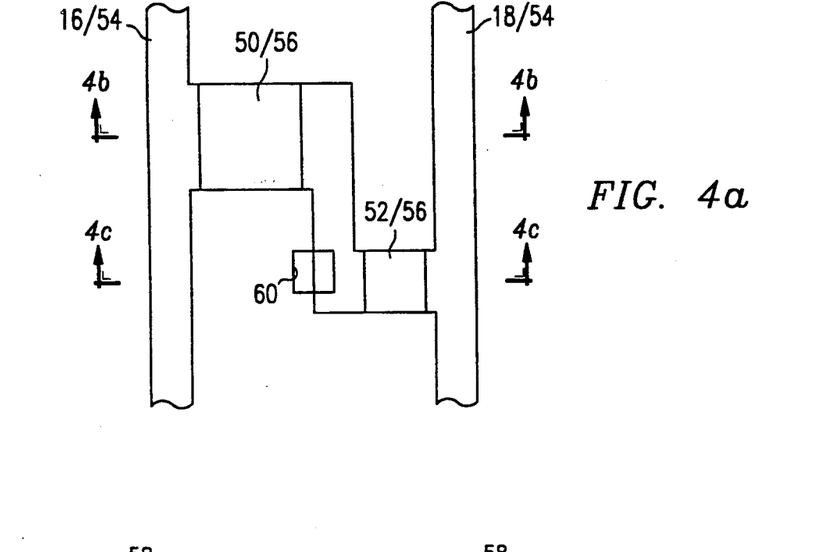
Figure 4B:
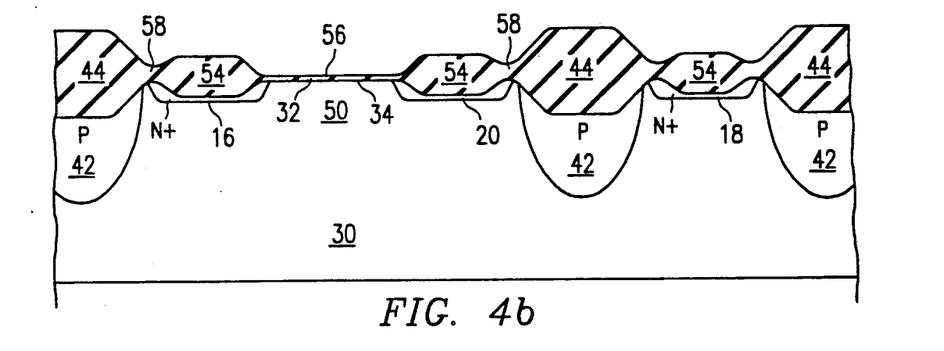
Figure 4C:
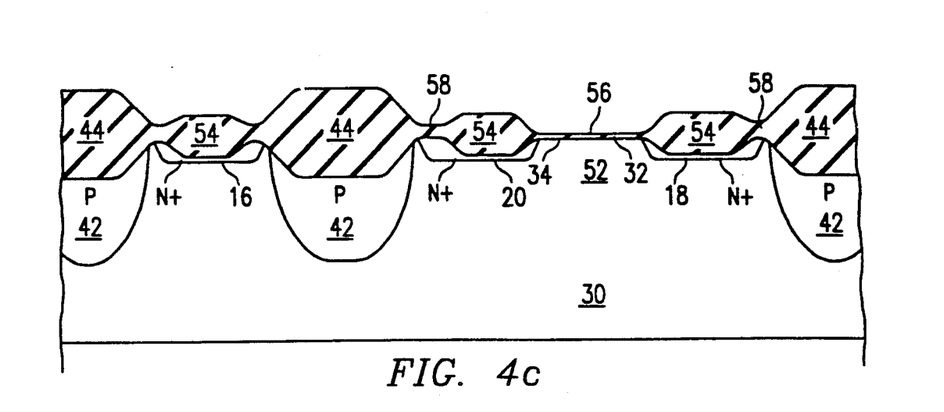

Referring next to FIGS. 4a-c, following the implant of the source/drain regions 16, 18 and 20, and conventional clean up, another thermal step is performed with steam at 800°–00° C. to differentially grow oxide regions 54. Thick oxide regions 54 will be grown to a thickness of approximately 2500 to 3500 Angstroms. At the same time, a thinner oxide layer 56 is formed across channel areas 50 and 52, and may have a thickness at this point of approximately 200–300 Angstroms. An implant process may be performed to adjust the threshold voltages $V_T$ of structures formed in the region of gate oxide 56. Oxide regions 54 grow at a faster rate than the thin oxide layer 56 because of the arsenic impurity in source/drain regions 16, 18 and 20.

At the transition areas 58 where the "bird's beaks" 46 have been formed, the originally-formed thermal oxide region 44 has masked the arsenic implant so that the dopant concentration is lower. The dopant concentration is "graded," decreasing as the oxide thickness of the overlying bird's beaks increases. Consequently the oxide growth in area 58 is less than that of oxide layer 54 forming a "dimple" of between 300 and 600 Angstroms thick.

As described in coassigned U.S. Pat. No. 5,008,721, incorporated herein by reference, tunneling windows are next formed in the oxide in the transition areas 58 ("dimple") adjacent the source/drain region 20. This is done by etching through the oxide over the transition area 58 in region 60 (see FIG. 4a) to the silicon using photoresist as a mask (not shown) and then regrowing a thinner oxide for the tunneling windows. This will create thin oxide tunneling windows 62 which are approximately 70–100 Angstroms thick (see FIG. 5c). At the time that this oxidation occurs, the gate oxide layer 56 will grow to approximately 350 Angstroms depending on its thickness before this step. A light phosphorous implant is preferably employed through transition area 58 in region 60 prior to etching to improve the field plate breakdown of the tunnel diode and the operation of the cells. The width of tunnel window 62 may be controlled by varying the length of time for the etch through transition areas 58 in area 60.

Figure 5A:
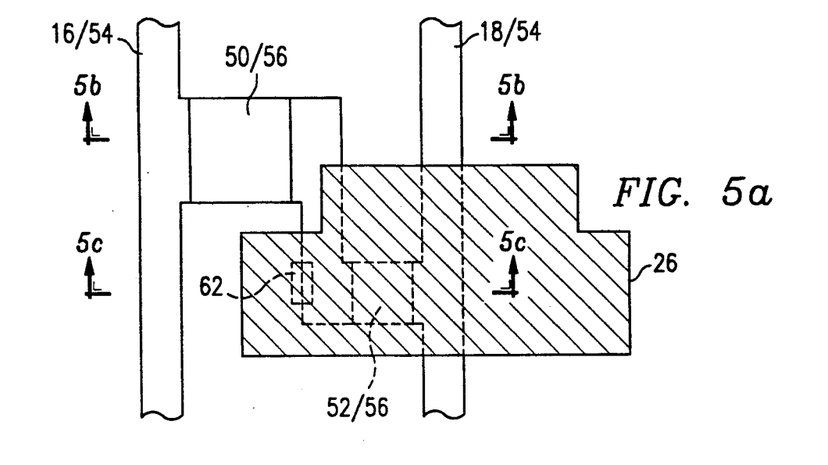
Figure 5B:
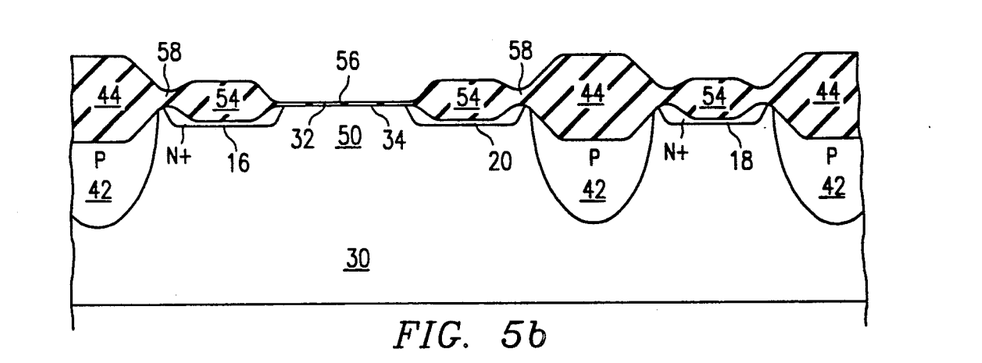
Figure 5C:
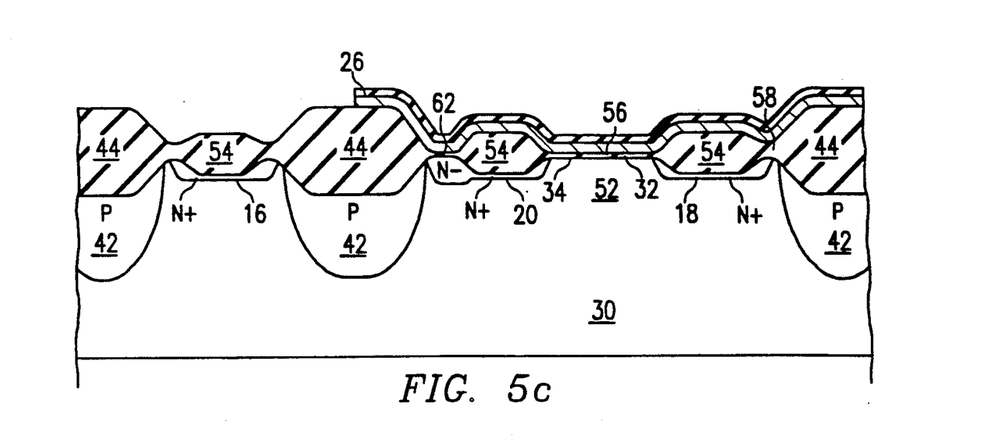

Referring next to FIGS. 5a-5c, a first polycrystalline silicon layer 26 ("poly1") is next deposited over the face of the slice and is doped n-type. Next, a layer of oxide/nitride/oxide (ONO) 64 is formed across the face of poly 1 (floating gate) layer 26 using a conventional method. Poly1 layer 26 and ONO layer 64 are then patterned and etched to define floating gate 26. Floating gate 26 extends over tunneling window 62 and channel 52. In the preferred embodiment floating gate 26 has a large surface area (FIG. 5a) to improve capacitive coupling with the later formed control gate.

Figure 6A:
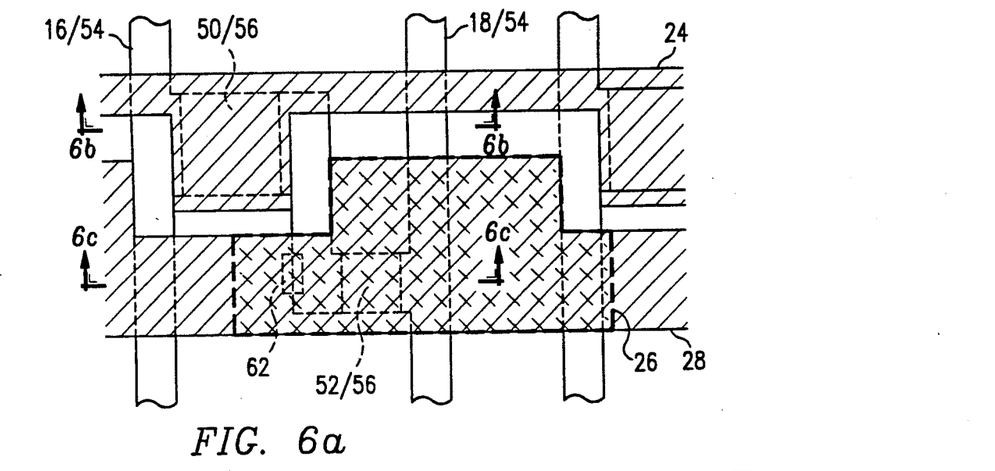
Figure 6B:
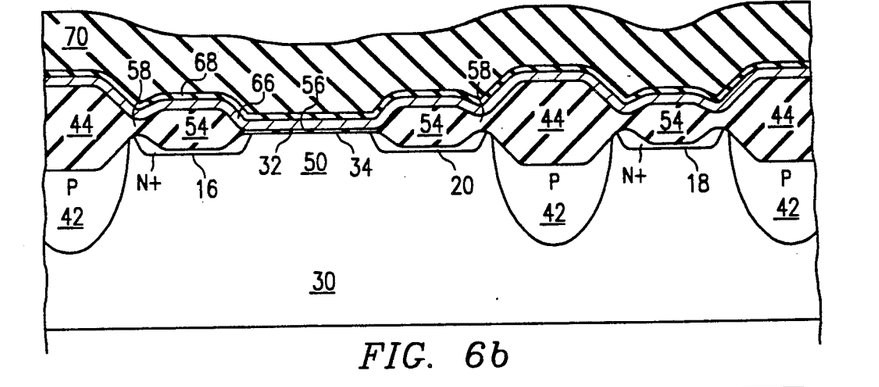
Figure 6C:
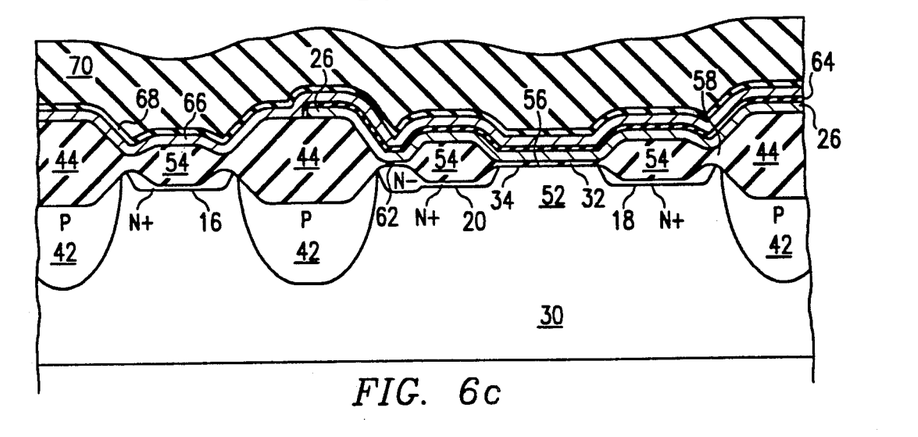

Referring next to FIGS. 6a-6c, after resist clean-up, an oxidation step is performed to provide gate oxide 56 in channel region 50 for the select transistor 12 during which time the exposed edges of poly1 layer 26 are also oxidized. The select transistor 12 threshold voltage may be adjusted at this stage by implantation. This is followed by the deposition of a second layer of polycrystalline 66 and is doped n+. Poly2 layer 66 is then masked and a stack etched of poly2 layer 66, interlevel insulator layer 64 and portions of floating gate (poly1 layer) 26 is performed. The stack etch defines the gate 24 of select transistor 12 (wordlines in the array) and the control gate 28 of memory transistor 14 (sense lines in the array). The stack etch further defines the boundaries of floating gate 26 such that the edges of floating gate 26 are now aligned with the corresponding edges of control gate (sense line) 28. An oxide layer 68 is then grown on the sides and top of the stack for enhanced date retention. A borophosphosilicate glass (BPSG) layer 70 is then deposited over the face of the wafer. Oxide layer 68 and BPSG layer 70 are not shown in FIG. 6a for clarity.

Figure 7:
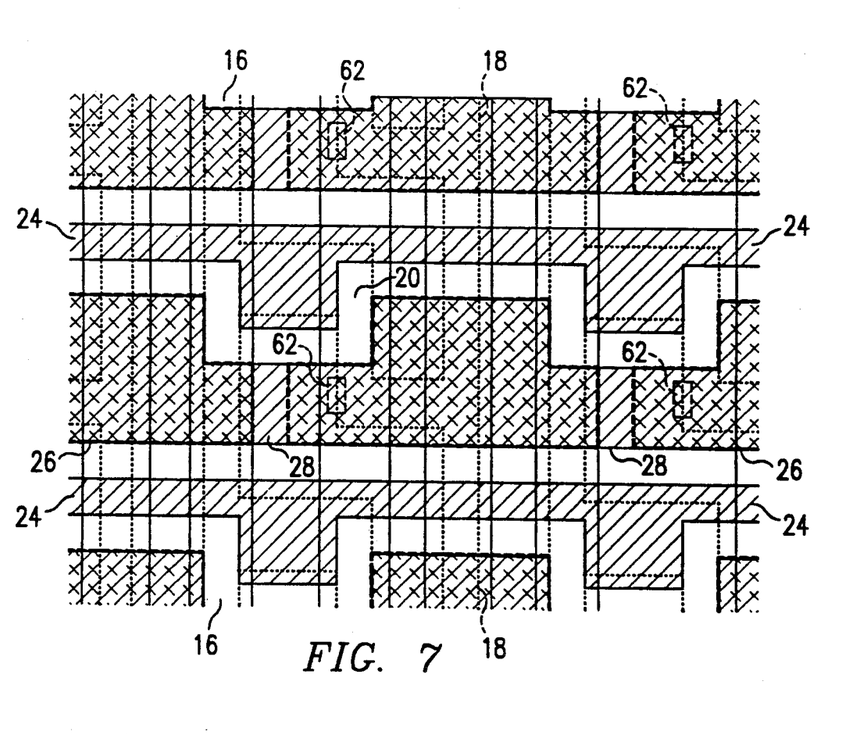
FIG. 7 is a greatly enlarged plan view of a small portion of an array of memory cells according to a first embodiment of the invention.

Referring next to FIG. 7, a small portion of an array of memory cells 10 is depicted, certain structures such as oxide layer 68 and BPSG layer 70 again are not shown for clarity. In the array configuration, source/drain regions 16 and 18 form elongated bitlines and ground lines respectively. The array may be contactless or may have one contact per sixteen, 32 or 64 memory cells 10. This may be accomplished by periodically tapping source/drain regions 16 and 18 with metal lines (not shown). In the array, gates 23 for the select transistors 12 along a row are formed as an elongated 24 wordline while the control gates 27 for the memory cells 14 along a row are formed as an elongated senseline 28.

It is also important to note that for both the single cell and array configurations of the preferred embodiment, the channel 50 of select transistor 12 is offset from the channel 52 of the memory transistor. This allows cells 10 to be efficiently pooled thereby increasing cell density in the array.

Figure 8:
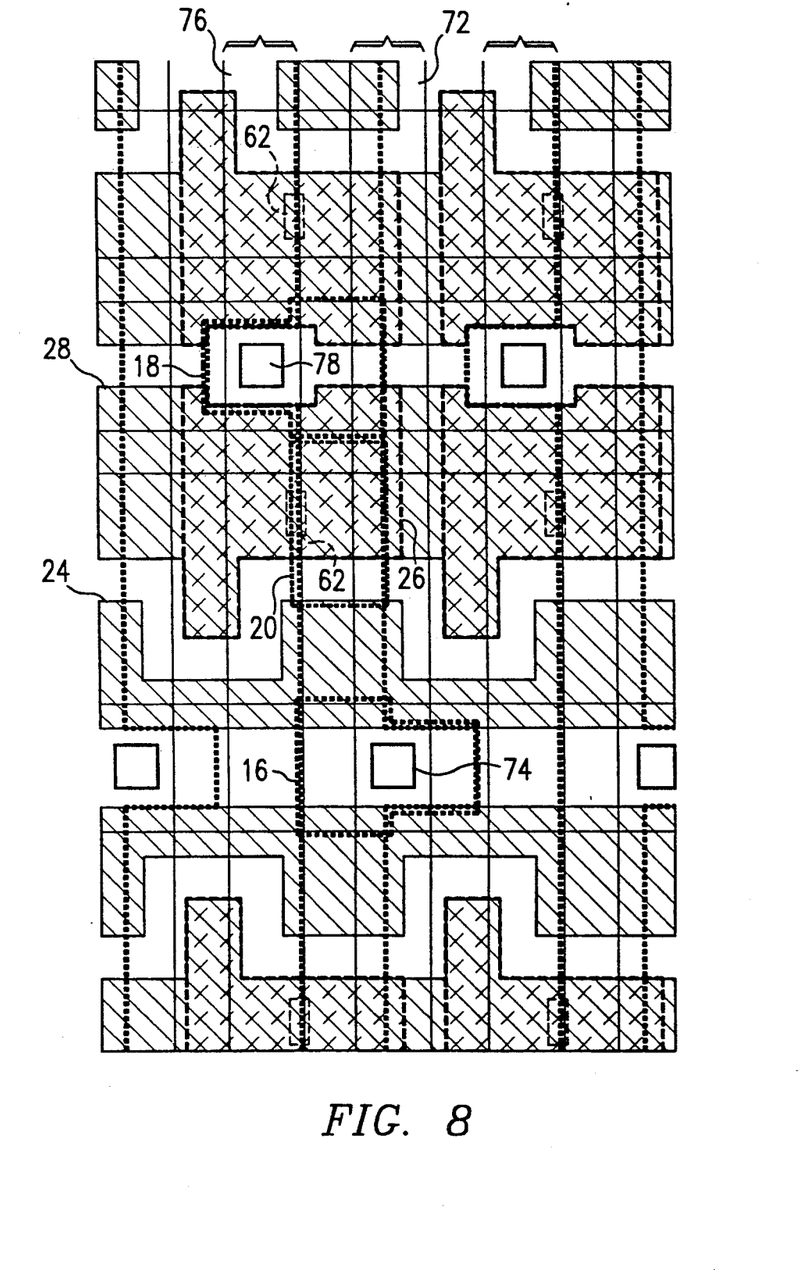
FIG. 8 is a greatly enlarged plan view of a small portion of an array of memory cells according to a second embodiment of the invention.

FIG. 8 depicts an alternate embodiment of an array of memory cells 10 according to the present invention. In the embodiment shown in FIG. 8, source/drain regions 16 are formed as discrete moats for each individual memory cell 10 rather than bitlines formed for an entire column of cells. For each row of cells, a metal bitline 72 couples each source/drain 16 moat in the row using contacts 74 to an associated row decoder (not shown). Similarly, a metal ground line 76 couples each source/drain region 18 along a row of cells 10 to an associated row decoder (not shown) using contacts 78. In the embodiment shown in FIG. 8, the select transistor 12 and memory transistor 14 of each memory cell 10 are formed substantially in line with each other, in contrast to the offset transistors 12 and 14 of the preferred embodiment shown in FIGS. 2-7.

Figure 9A:
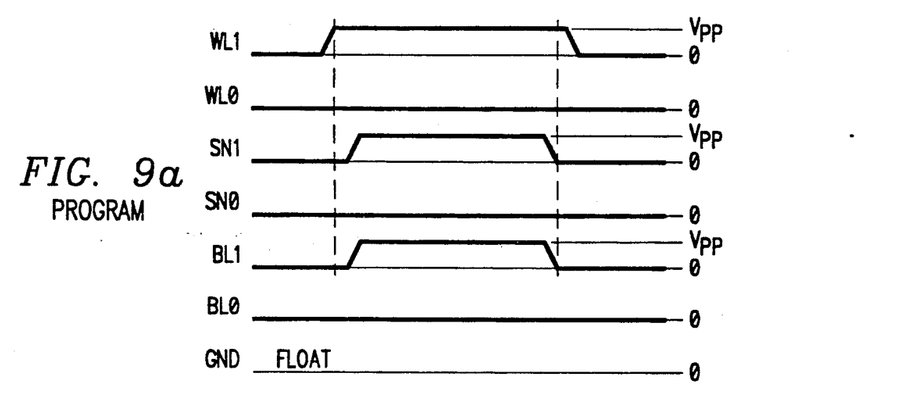
FIGS. 9a-9c are a series of waveform drawings depicting the preferred programming, erasing and reading voltage waveforms.
Figure 9B:
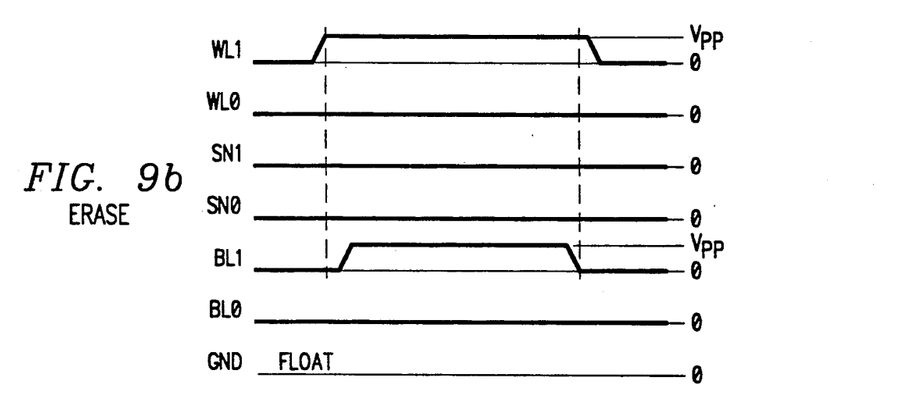
Figure 9C:
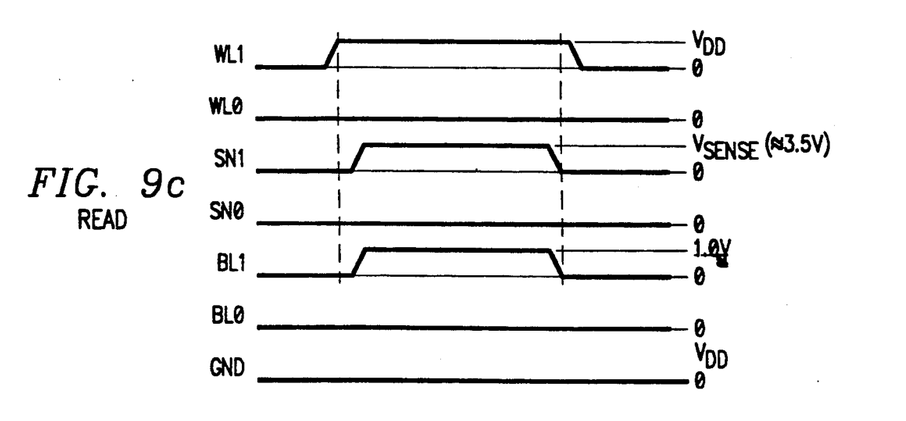

The operation of a selected memory cell depicted in FIG. 1 can now be described, using cell (1,1) as an example, in conjunction with the Table I and the voltage waveforms depicted in FIG. 9.

TABLE I

| | OPERATIONAL VOLTAGES | | | | | | | |
|---|---|---|---|---|---|---|---|---|
| | WORDLINE (WL) 24 | | SENSELINE (SL) 28 | | BITLINE (BL) 16 | | GROUNDLINE 18 | |
| Operation | Select | Deselect | Select | Deselect | Select | Deselect | Select | Deselect |
| Program | $V_{pp}$ | 0 | $V_{pp}$ | 0 | 0 | $V_{pp}$ | float | float |
| Erase | $V_{pp}$ | 0 | 0 | 0 | $V_{pp}$ | 0 | float | float |
| Read | $V_{DD}$ | 0 | $V_{SENSE}$ | 0 | 1.0 | 1.0 | 0 | 0 |

In the write or program mode, row decoder 29 applies a high voltage $V_{pp}$ (approximately +17 to +18 volts) to the wordline 24 and senseline 28 of the row containing the selected cell, in this case the wordline labeled WL1 and the senseline labeled SN1. It is important to note that the wordline 24 (i.e. the gate 23 of the select transistor 12) should be turned on prior to turning on the senseline 28 (i.e. the control gate 27 of the selected EEPROM transistor 14). Additionally, the waveforms of the applied voltages should have gradual risetimes rather than sharp transitions, as shown in the art. At the same time, row decoder 29 brings the remaining wordlines 24 and sense lines 28 in the array, such as wordline WL0 and senseline SN0 in FIG. 1, to approximately zero volts. Column decoder 22 brings the bitline 16 of the column containing the selected cell, in this example the bitline 16 labeled BL1, to approximately zero volts. The column decoder 22 brings the remaining bitlines 16 in the array, such as the bitline BL0 in FIG. 1, to a high voltage $V_{pp}$ (+17 to +18 volts) and allows the ground lines 18 in the array to float. It is important to note that wordline WL1 should be turned on prior to applying $V_{pp}$ to selected senseline SN1 and all deselected bitlines BL0. Additionally, $V_{pp}$ should be applied to senseline SN1 and bitline BL0 at the same time, and should have gradual rise time rather than sharp transition (see FIG. 9). To prevent the deprogramming of already programmed bits, the voltage applied to deselected bitlines (BL) may be reduced from $V_{pp}$ to a lower value, such as $V_{pp/2}$. The voltage difference created between source/drain region 20 of cell (1,1) and the corresponding control gate 30 result in floating gate 26 being charged by Fowler-Nordheim tunneling.

To read cell (1,1), row decoder 29 applies a select voltage $V_{dd}$ (approximately +5 volts) to the wordline 24 of the row containing the selected cell, in this case the wordline 24 labeled WL1, and approximately zero volts to the remaining word lines 24 in the array, in FIG. 1 the wordline labeled WL0. Row decoder 29 applies a voltage $V_{sense}$ (approximately +5 volts) to the senseline 28 of the row containing the selected cell, in this example senseline SN1, and approximately zero volts to the remaining sense lines in the array, in this example senseline SN0. Column decoder 22 applies a voltage of approximately 1.0 volts to each of the bitlines 16 in the array, in this example bitlines BL0 and BL1. Column decoder 22 also brings all the ground lines 18 to approximately zero volts.

The charge or lack of charge on floating gate 26 can then be sensed by detecting either the lack of current flow or current flow between first source/drain region 16 and second source/drain region 18, thereby reading said cell.

To erase a selected cell or selected cells (in a byte or block erase) in the array, row decoder 29 applies a high voltage $V_{pp}$ (approximately +17 to +18 volts) to the wordline 24 or wordlines 24 of the row or rows containing the selected cell or cells, in this example the wordline labeled WL1. At the same time, row decoder 29 applies approximately zero volts or ground to the deselected word lines 24 in the array, in this example, the wordline labeled WL0. A voltage of approximately zero volts or ground is applied to each of the sense lines 28, in this example the sense lines labels SN0 and SN1 by row decoder 29. The bitline or bitlines 16 containing the selected cell or cells to be erased, in this example a bitline BL1, is brought to a high voltage $V_{pp}$ (approximately +17 to +18 volts) by a column decoder 22 while the deselected bitline or bitlines 16, in this case bitline BL0, are brought to approximately zero volts or ground. The ground lines 18 are allowed to float. The resulting voltage difference between the source/drain region 20 of the selected cell or cells and the wordline (control gate) 24 of the selected column cause a removal of charge from the floating gates 28 of the selected cells or cells through Fowler-Nordheim tunneling, thereby erasing the selected cells or cell in the array.

While preferred embodiments of the invention and their advantages have been set forth in the above-detailed description, the invention is not limited thereto, but only by the scope and spirit of the appended claims.

What is claimed is:

1. A method for using an electrically-erasable, electrically-programmable read-only memory cell formed at a face of a layer of semiconductor of a first conductivity type and including first and second source/drain regions formed in the face of a second conductivity type opposite the first conductivity type and spaced by a first channel area, a third source/drain region formed in the face of the second conductivity type and spaced from the second source/drain region by a second channel area, a thick insulator region formed adjacent at least a portion of the second source/drain region remote from the first channel and having a lateral margin of sloped thickness overlying a corresponding lateral margin of the second source/drain region, the corresponding lateral margin of the second source/drain region having a graded dopant concentration directly proportionate with the sloped thickness of the overlying lateral margin of the thick insulator, a differentially grown insulator region overlying the second source/drain and having a lateral margin of sloped thickness, a thin insulator tunneling window overlying an area of the second source/drain region, the tunneling window formed between and spacing the lateral margin of the thick insulator region and the lateral margin of the differentially grown insulator region, a floating gate conductor disposed adjacent the tunneling window and insulatively adjacent the first channel area a gate conductor insulatively adjacent the second channel area, and a control gate conductor insulatively adjacent the floating gate conductor, the method comprising the steps of:

programming the memory cell, said step of programming the memory cell comprising the substeps of:
applying a high voltage to the gate conductor;
applying a high voltage to the control gate conductor;
applying approximately zero volts to the first source/drain region;
allowing the second source/drain region to float; and
in response to said substeps of applying voltages charging the floating gate conductor with electrons via Fowler-Nordheim tunneling;

reading the memory cell, said step of reading comprising the substeps of:
applying a select voltage to the gate conductor;
applying a sense voltage to the control gate conductor;
applying a reading voltage to the first source/drain region;
applying approximately zero volts to the second source/drain region; and
in response to said substeps of applying voltages, measuring current flow between the first source/drain region and the second source/drain region thereby reading the cell; and erasing the memory cell, said step of erasing comprising the substeps of:
applying a high voltage to the gate conductor;
applying approximately zero volts to the control gate conductor;
applying a high voltage to the first source/drain region;
allowing the second source/drain region to float; and
in response to said steps of applying voltages, removing electrons from the floating gate conductor via Fowler-Nordheim tunneling.

2. The method of claim 1 wherein the high voltage is in the range of +17 to +18 volts.

3. The method of claim 1 wherein the select voltage is approximately +5 volts.

4. The method of claim 1 wherein the sense voltage is approximately +5 volts.

* * * * *